United States Patent
Oike et al.

(10) Patent No.: US 9,191,026 B2
(45) Date of Patent: Nov. 17, 2015

(54) IMAGE SENSOR AND IMAGING METHOD WITH SINGLE SHOT COMPRESSED SENSING

(71) Applicants: SONY CORPORATION, Tokyo (JP); BOARD OF TRUSTEES OF THE LELAND STANFORD JUNIOR UNIVERSITY, Stanford, CA (US)

(72) Inventors: Yusuke Oike, Tokyo (JP); Abbas El Gamal, Stanford, CA (US)

(73) Assignees: SONY CORPORATION, Tokyo (JP); THE BOARD OF TRUSTEES OF THE LELAND STANFORD JUNIOR UNIVERSITY, Palo Alto, CA (US)

( * ) Notice: Subject to any disclaimer, the term of this patent is extended or adjusted under 35 U.S.C. 154(b) by 339 days.

(21) Appl. No.: 13/769,471

(22) Filed: Feb. 18, 2013

(65) Prior Publication Data

US 2014/0231620 A1 Aug. 21, 2014

(51) Int. Cl.
   *H01L 27/00* (2006.01)
   *H03M 3/00* (2006.01)
   *H04N 5/335* (2011.01)

(52) U.S. Cl.
   CPC .............. *H03M 3/458* (2013.01); *H04N 5/335* (2013.01)

(58) Field of Classification Search
   CPC ...................................................... H03M 3/458
   USPC ...................................................... 250/208.1
   See application file for complete search history.

(56) References Cited

U.S. PATENT DOCUMENTS

| 8,310,580 | B2 | 11/2012 | Suzuki et al. | |
|---|---|---|---|---|
| 2001/0052864 | A1* | 12/2001 | Shimizu et al. | ............... 341/141 |
| 2008/0033266 | A1* | 2/2008 | Diab et al. | ................... 600/336 |
| 2011/0043397 | A1* | 2/2011 | Carreau | ....................... 341/141 |

OTHER PUBLICATIONS

Candes, Emmanuel J. and Michael B. Wakin. "An Introduction to Compressive Sampling." IEEE Signal Processing Magazine. Mar. 2008. pp. 21-30.

Mun, Sungkwang and James E. Fowler. "Block Compressed Sensing of Images Using Directional Transforms. Proceedings of the International Conference on Image Processing." Cairo, Egypt, Nov. 2009, pp. 3021-3024.

Toyama, Takayuki et al. "A 17.7Mpixel 120fps CMOS Image Sensore with 34.8Gb/s Readout." 2011 IEEE International Solid-State Circuits Conference. pp. 420-422.

(Continued)

*Primary Examiner* — Thanh Luu
(74) *Attorney, Agent, or Firm* — Oblon, McClelland, Maier & Neustadt, L.L.P.

(57) ABSTRACT

A CMOS image sensor includes a plurality of pixel elements arranged in a two-dimensional array, analog signal multiplexers, over-sampling A/D converters and an activation code generator. The sensor is configured to construct an image by using less number of A/D conversions, thereby reducing the power consumption of the sensor. The activation code generator generates a bit stream of random binary sequences which determine which A/D converter is activated. The image sensor offers digitally compressed data, the number of which is significantly less than the total number of pixels. Further, the image sensor not only reduces the power consumption of the A/D converters (by reducing the number of A/D conversions) but also reduces the I/O power consumption. An original image focused on the sensor is recovered from the compressed data by using principles of compressed sensing.

20 Claims, 11 Drawing Sheets

(56) References Cited

OTHER PUBLICATIONS

Takhar, Dharmpal et al. "A New Compressive Imaging Camera Architecture using Optical-Domain Compression." Department of Electrical and Computer Engineering, Rice University. Proc. IS&T/SPIE Computational Imaging IV, Jan. 2006. pp. 1-10.

Robucci, Ryan et al. "Compressive Sensing on a CMOS Separable-Transform Image Sensor." IEEE Dec. 31, 2009. pp. 1-11.

\* cited by examiner

FIG. 11

IMAGE SENSOR AND IMAGING METHOD WITH SINGLE SHOT COMPRESSED SENSING

BACKGROUND

1. Field of the Disclosure

This disclosure relates to a sensor and a method of efficiently reducing power consumption associated with analog to digital converters of an image sensor.

2. Description of the Related Art

Low power consumption is a primary concern in many CMOS image sensor applications. As the resolution of these sensors has increased while maintaining or increasing their frame rate, the analog to digital conversion (A/D) associated with the sensors has become a dominant component of power consumption. Typical image compression techniques reduce the readout rate (and hence the I/O power consumption), but cannot reduce the power consumption associated with the A/D conversions.

A naïve solution to reduce the power consumption is to skip a readout, wherein the number of pixels accessed for composing an output image is reduced so that the bandwidth of the A/D conversion decreases. In doing so a high frame rate of imaging (or reduction of power consumption) per frame is obtained, but the detailed information of the image is lost as the spatial sampling frequency (Nyquist frequency) degrades.

Another technique is to implement an on-chip image compression using a well known transform basis such as a discrete cosine transform or a wavelet transform. This approach compresses the output bandwidth and keeps the features of the image object, but it cannot reduce the bandwidth of the A/D conversion. Hence the frame rate is limited by the A/D conversion and the impact of power reduction is also insufficient.

Accordingly there is a requirement to lower the power consumption of the A/D converters in order to utilize the device in an efficient manner.

SUMMARY

A device and method for operating an image sensor in order to lower the A/D power consumption of the device are discussed herein.

The present disclosure describes approaches for obtaining a lower power consumption, not only by suppressing the output data bandwidth, but also the number of A/D conversions. The power consumption of A/D converters accounts for approximately 55% of the total power consumed by image sensors, whereas the data input-output (I/O) operations consume approximately 20% of the power. The present disclosure describes ways of reducing the amount of power consumed by the A/D converters by, for example, 44% of the total power consumed by the sensor. Further, by the present disclosure, the compressed data used for image recovery is provided in a 'single-shot', wherein each pixel of the sensor is accessed only once during signal readout. This capability provides the advantageous feature of allowing the sensor to capture moving objects.

Accordingly, one exemplary embodiment of the disclosure is directed to an image sensor comprising: a plurality of pixel elements, wherein each pixel element is configured to generate an analog signal corresponding to an intensity of light impinged on the pixel element; a plurality of analog to digital, A/D, converters, wherein each A/D converter is configured to sample a corresponding average value of an input analog signal and convert the input analog signal to a digital signal based on a predetermined activation code that determines which of the plurality of A/D converters is activated; and a plurality of multiplexers, wherein each multiplexer is connected to a pixel block and a first subset of the plurality of A/D converters and is configured to sequentially select and distribute the analog signal and following analog signals from the pixel block to the A/D converters in a cycle of A/D conversion.

According to another exemplary embodiment, the disclosure is directed to an image processing method performed by an image sensor, the method comprising: generating a plurality of analog signals from a plurality of pixel elements, each analog signal corresponding to an intensity of light impinged on the corresponding pixel element; selecting by a decoder, a subset of analog signals generated by the generating; multiplexing sequentially the subset of analog signals selected by the selecting and distributing the subset of analog signals to a plurality of analog to digital, A/D, converters; generating a random activation code that determines which of the plurality of A/D converters is activated; and obtaining a digital readout of the analog signals from the activated A/D converters.

The foregoing general description of the illustrative implementations and the following detailed description thereof are merely exemplary aspects of the teachings of this disclosure, and are not restrictive.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION

Figure 1:
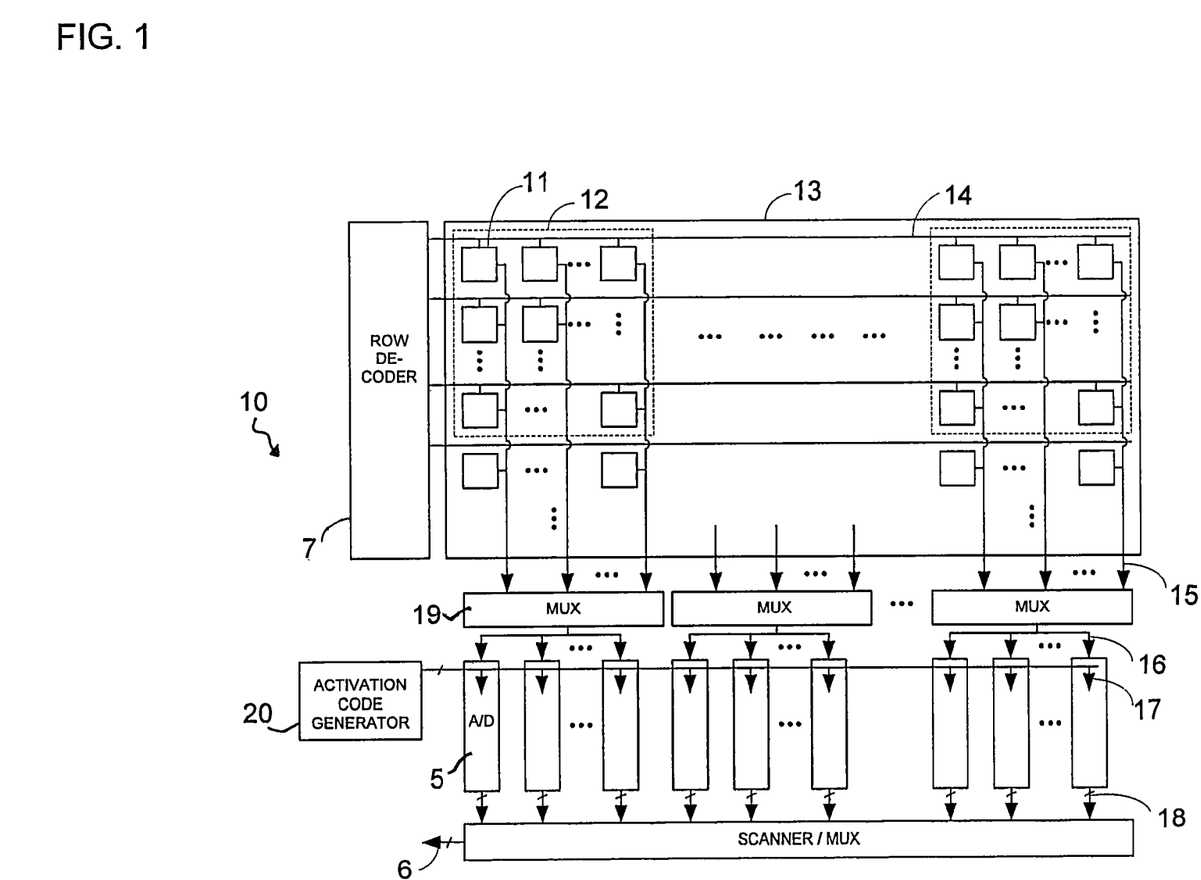
FIG. 1 is a block diagram of an image sensor.

Referring now to the drawings, wherein like reference numerals designate identical or corresponding parts throughout the several views, FIG. 1 is a block diagram of a configuration of an image sensor. The image sensor as depicted in FIG. 1 is fabricated by a CMOS process and includes a two-dimensional pixel array 13 of photo-detectors 11, a plurality of analog signal multiplexers 19, oversampling analog to digital converters 5, an activation code generator 20 and a scanner (multiplexer) 6 to provide the digital output. The image sensor of FIG. 1 is formed on a single integrated circuit chip, but could also be fabricated and assembled in separate component pieces.

Each light detecting element (pixels) includes a photo detector that is configured to generate photoelectrons proportional to the magnitude of light impinging on the photo detector. Analog electric signals corresponding to the photoelectrons are output into vertical signal lines 15 from the selected pixels.

The two-dimensional array of photo-detectors (also referred to as pixels) 13 is further divided into units of pixel block 12. Each unit of pixel block includes a predetermined number of pixels that are arranged in a two-dimensional array. There is no restriction on the dimensionality of the pixels. The pixels could be arranged in one or three dimensions as well. In this example each unit of pixel block is arranged as an n×n configuration of pixel elements 11 that are connected to dedicated corresponding multiplexers 19 via a plurality of vertical signal lines 15. The multiplexers are connected to a group of dedicated analog to digital converters which convert an input analog signal into a digital signal 18 applied via a scanner/mux.

An analog signal from a unit of pixel block 12 is sent to a corresponding analog signal multiplexer 19 and further distributed to more than one oversampling A/D converter 5. The A/D converters are arranged in a parallel bank of converters. Each A/D converter 5 receives an activation code (binary random configuration code) from an activation code generator 20. The activation code determines whether the A/D converter 5 samples the input or not. Specifically, when a bit of the activation code is negative the A/D converter 5 associated with a bit samples a reference signal instead of the input analog signal or merely stops sampling temporarily. During the oversampling operation of the A/D converter 5, an input to the multiplexer is switched to the next analog signal in a unit of pixel block while the activation code changes. The A/D conversions operate for each unit of pixel block in a parallel fashion (such that respective bits in the code enable/disable the respective A/D converters 5). Further, the image sensor 10 offers digital compressed data, the amount of which is sufficiently less than that which would be produced by the total number of pixels. An original image that is focused on the sensor can then be recovered from the compressed data by using the principles of compress sensing (to be discussed in detail later).

Figure 2:
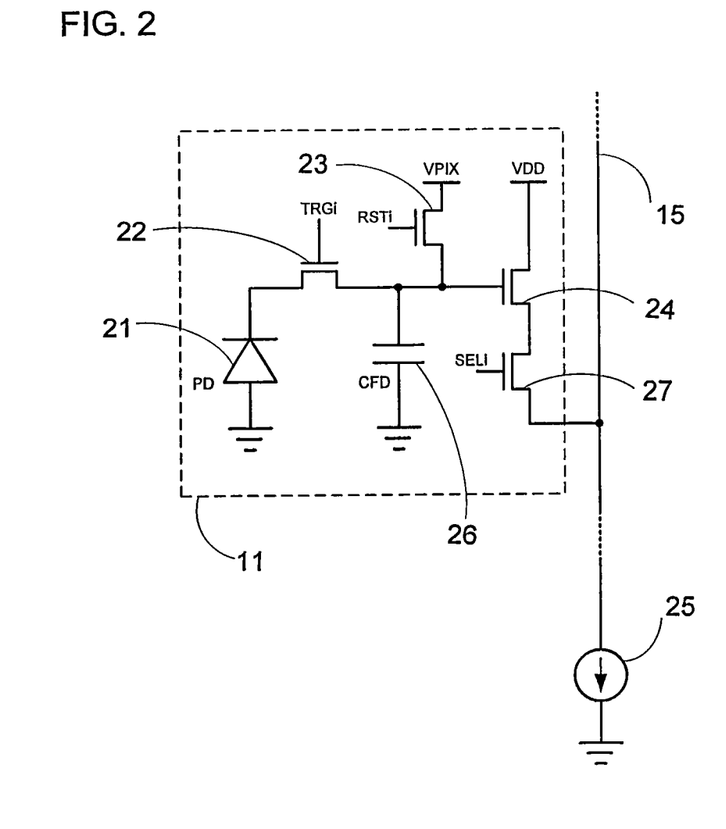
FIG. 2 is an example pixel element of the image sensor.

FIG. 2 is a schematic diagram of a pixel element according to one embodiment of the present disclosure. Each pixel element 11, includes a photo detector 21, a transfer gate 22, a reset gate 23, an amplifier gate 24, a select gate 27, and a parasitic capacitance of floating diffusion 26. The amplifier transistor connects to the vertical signal line 15 which connects to a current source 25, via the select transistor ($SEL_i$).

A photo-detector generates photo electrons corresponding to the intensity of light impinging on a pixel. The parasitic capacitance of floating diffusion 26 is reset to a reset voltage (VPIX) by switching on the reset transistor RSTi. After the reset transistor turns off, the transfer gate 22 is activated in order to transfer the photo-electrons generated by the photo detector to the floating diffusion region of the parasitic capacitance 26. The voltage at the floating diffusion region changes from the reset level voltage to the signal level related to the photo electrons.

When the select transistor SELi is activated, a source follower circuit which includes the amplifier transistor and the current source 25, outputs an analog signal corresponding to the signal level voltage at the capacitor (CSD). Further, note that both the reset and the signal level voltage can be sequentially read out so that offset noise of the signal readout is suppressed by calculating the difference between the reset and signal levels. This method of noise suppression is referred to as a correlated double sampling method (CDS). Further, note that the pixel configuration as described above is in no way limiting the scope of the present disclosure. Any pixel configuration that provides an analog signal related to the intensity of light impinging on the pixel can be used.

Figure 3:
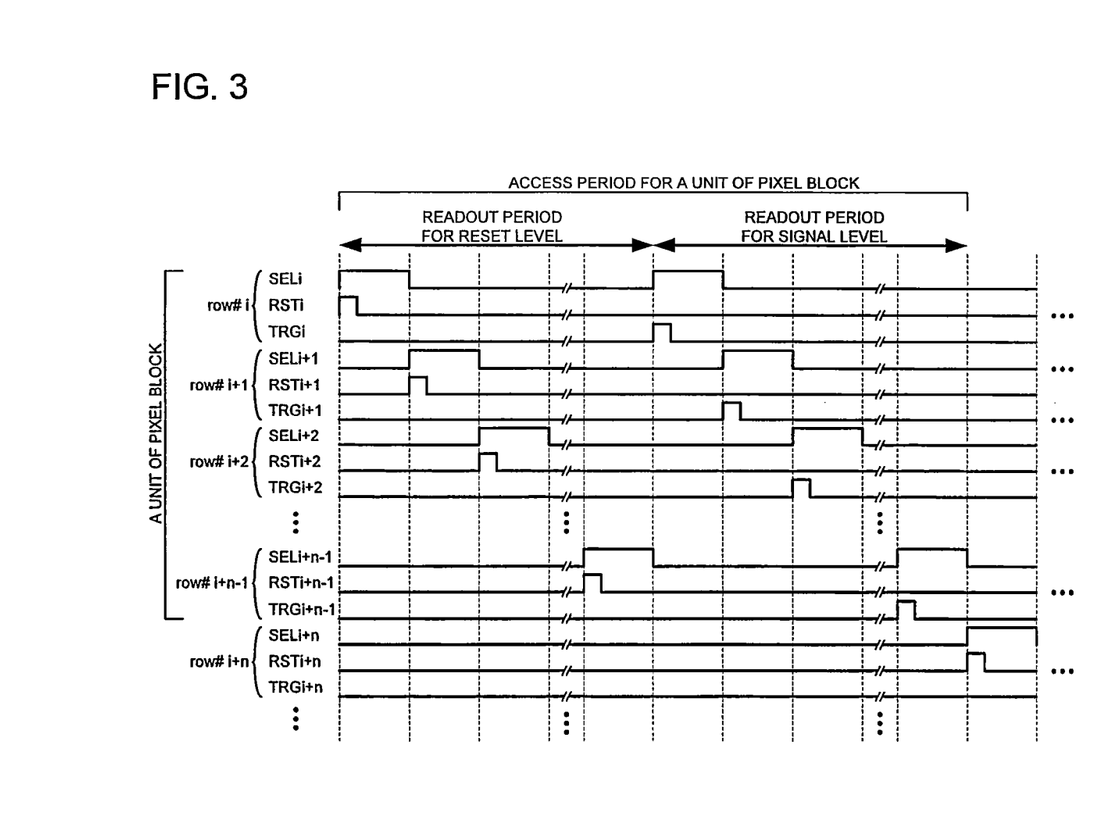
FIG. 3 is a timing diagram representing an access period for a unit pixel block.

FIG. 3 is a timing diagram illustrating an access period of a unit of pixel block. Note that the access period for the unit of pixel block includes of a readout period for a reset level and a readout period for a signal voltage level.

A cycle of A/D conversion operates on a unit of pixel block which includes an arbitrary number of pixels. For example, a unit of pixel block can be represented as a pixel array including 16×16 pixels. Specifically, a total of N pixel elements, can be represented by an array of n×n pixels. Therefore, a total of 256 pixel elements can be represented as a 16×16 array. Note, however, that the block size and shape of the unit of pixel block is not limited to an n×n configuration.

One readout period for an A/D conversion includes a sequential pixel readout for a unit of pixel block as shown in FIG. 3. Specifically, row #i to row #i+n−1 are sequentially read out from the pixel block in a single access period. When the select signal #i connected to the select transistor on row #i turns on, the analog signals on row #i are read out. Note that during a readout period select signals from #i to #i+n−1 are sequentially activated to access all the pixels in a unit of n×n pixels. To obtain both of the reset and signal levels for the CDS operation, two readout periods for reset and signal levels are sequentially carried out. Further, after completing the access for a unit of pixel block the readout operation moves to the next unit #(i+n).

Note that the signal readout as described above is carried out only once for each pixel and the image capture is completed by scanning the readout from the beginning to the end of a row. In other words, the imaging as described above offers an output image in a single shot, wherein each pixel of the sensor is accessed only once during signal readout.

Figure 4:
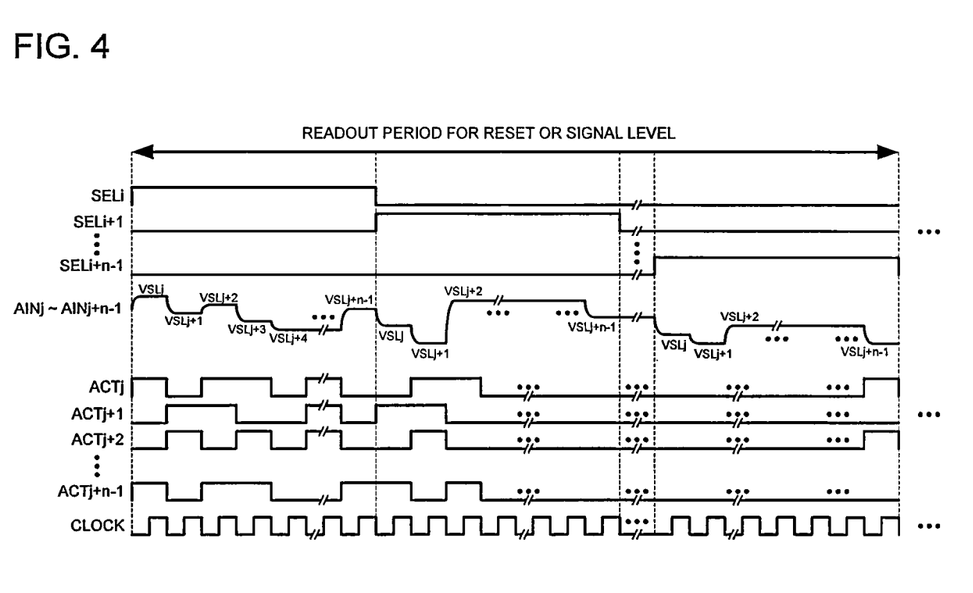
FIG. 4 is an exemplary timing diagram that illustrates the encoding of the analog signal with random activation codes.

FIG. 4 illustrates a timing diagram of encoding analog signals with random activation codes during a readout period for a reset or signal level. Note that FIG. 4 shows an operation for a unit of pixel block and that the same operation is carried out for each unit of pixel block in parallel. The A/D converter samples the analog signals synchronized with a clock according to the activation code.

In the present embodiment, an n:1 multiplexer is used to distribute the analog signals from the pixel elements to the bank of A/D converters. The multiplexer chooses one signal for multiple A/D converters from the analog signals of a unit of pixel block and then sequentially switches them in one readout period. Signals $AIN_j$ to $AIN_{j+n-1}$ are distributed to dedicated A/D converters by the n:1 multiplexer. Specifically, the vertical signal lines $VSL_j$ to $VSL_{j+n-1}$ of the row #i to row #i+n−1 are captured during one readout period of a cycle of A/D conversion. An activation code generated by the activation code generator provides different binary streams of random configurations to each A/D converter ($ACT_j$ to $ACT_{j+n-1}$).

Note that the same pattern of the activation code generator can be supplied to the other units of the pixel block. A clock determines the sample timing of the input signals at the A/D converters which are activated based on the activation code received by the generator. Specifically, if the activation code is high, the A/D converter is activated and samples the input analog signal. If the activation code is low, the A/D converter is switched off. Note that each A/D converter dedicated to a unit of pixel block samples a different set of analog signals in parallel. Specifically, based on the activation codes generated by the activation code generator 20, each A/D samples a different set of analog signals in a parallel fashion. Further, to obtain both the reset and signal levels the same pattern of activation code is offered at each readout period to the A/D converters.

Figure 5:
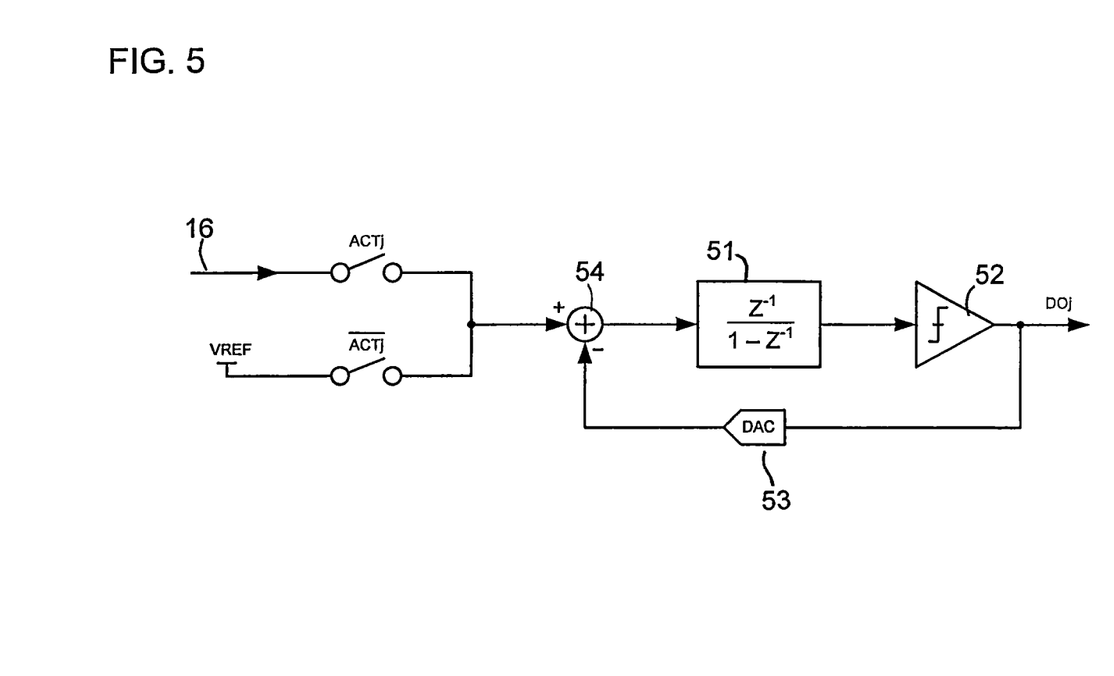
FIG. 5 is an exemplary analog to digital converter according to one aspect of the present disclosure.

FIG. 5 is a block diagram of a preferred A/D converter according to one embodiment of the present disclosure. The A/D converter represented in FIG. 5 is a first order Delta-Sigma modulator. The A/D converter comprises an integrator 51, a comparator 52, a one bit DAC 53 and an accumulator 54.

In addition to this configuration the A/D converter comprises an input selector controlled by the activation code $ACT_j$. In case the ACT turns positive, an analog signal 16 is input to the A/D converter, whereas if the ACT is negative, the reference signal VREF is input to the A/D converter. The Delta-Sigma modulator integrates the input signal in synchronization with a clock signal while subtracting an offset or adding an offset to the input signal according to the result of the comparator. It outputs a stream of bits representative of the input analog signal AIN. Further, a digital filter converts the digital stream to a digital code. Each A/D converter can comprise a digital filter in addition to the Delta-Sigma modulator to further reduce the output bandwidth.

Specifically, a delta-sigma ADC first encodes an analog signal using delta-sigma modulation and then applies a digital filter to form a higher-resolution digital output. In other words, the analog signal is converted into a stream of pulses. This is advantageous because it is very easy to regenerate pulses at the receiver into the ideal form transmitted. The only part of the transmitted waveform required at the receiver is the time at which the pulse occurred. Given the timing information the transmitted waveform can be reconstructed electronically with great precision. In contrast, without conversion to a pulse stream but simply transmitting the analog signal directly, all noise in the system is added to the analog signal, reducing its quality.

The ADC converts the mean of an analog voltage into the mean of an analog pulse frequency. The output of the A/D converter represented by $DO_j$ transitions between high output levels and low output levels. A count of the total number of high states represents the digital signal.

The image sensor as described by the first embodiment of the present disclosure in FIG. 1 uses the principles of compressed sensing to reduce the number of A/D conversions and thus reduce the power consumption of the device. In what follows we first describe the principles of compressed sensing as used by the image sensor in achieving the low power consumption and then describe another embodiment of the image sensor.

According to compressed sensing a compressible signal can be recovered from a small number of random measurements by sparsity promoting non-linear recovery algorithms. Therein, the number of A/D conversions represented by M can be sufficiently less than the number of pixels in a unit of pixel block represented by N, to recover the original image. When M number of A/D converters are simultaneously dedicated to N pixels, the image sensor outputs M digital codes for the N pixels so that the compression ratio M/N can be sufficiently less than 1 (M/N<<1).

The power consumption and bandwidth of both the A/D conversion and input-output transmission can be suppressed by a factor of M/N in comparison to a normal operation wherein N, A/D conversions are required to obtain an image of N pixels. For example, 16 A/D converters dedicated for a unit of pixel block of 256 pixels achieves a compression ratio of 1/16. Note that the compression ratio can easily be varied by changing the number of A/D converters dedicated for a unit of pixel block at the multiplexers. Further, this feature also enhances the frame rate for a given power consumption level, as frames are outputted at the rate of N/M (>>1).

A transform basis for the compression is provided as the activation code for the bank of A/D converters. A preferred transform basis, $\Phi$, is highly incoherent (uncorrelated) to a compressible basis, $\Psi$, which has a capability to compress the original signal as a sparse transform. Note that the compressible basis, $\Psi$, can be achieved by a discrete cosine transform (DCT) or a Wavelet transform which are well-known compressible basis for JPEG and JPEG2000 images. A transform basis, $\Phi$, is a random binary matrix which is used for compressed sensing. To generate the activation codes corresponding to $\Phi$, an embodiment of the present disclosure describes an activation code generator as a pseudo-random pattern generator which offers a known random pattern according to a given seed (to be discussed later with reference to FIG. 9).

The image sensor in FIG. 1 recovers a real value signal x of length N from M samples, M<<N. Specifically, a signal x is to be recovered from y=$\Phi$x, where y has a length M and $\Phi$ is an M×N measurement matrix. Because the number of unknowns, x, is much larger than the number of observations, y, recovering every x from the corresponding y is in general not possible. However, if x is sufficiently sparse, exact recovery is possible. Often the requisite sparsity exists with some respect to a transform matrix, $\Psi$, such as a discrete cosine transform or a Wavelet transform. In this case, the key to compressed sensing recovery is the production of a sparse set of transform coefficients x'=$\Psi$x. The measurements y can be obtained as follows: y=$\Phi\Psi^{-1}$x', wherein $\Psi^{-1}$ is the inverse transform $\Psi$. Note that the measurement matrix $\Phi$ must be uncorrelated to the discrete cosine transform matrix $\Psi$. Hence, a usual choice for the measurement basis $\Phi$ is a random matrix. Thus, according to one embodiment of the present disclosure the matrix is supplied as random activation codes which are generated by the activation code generator (to be discussed in FIG. 9). Further, note that a candidate for the uncorrelated transform basis $\Phi$ can also be a noiselet transform basis.

Figure 6:
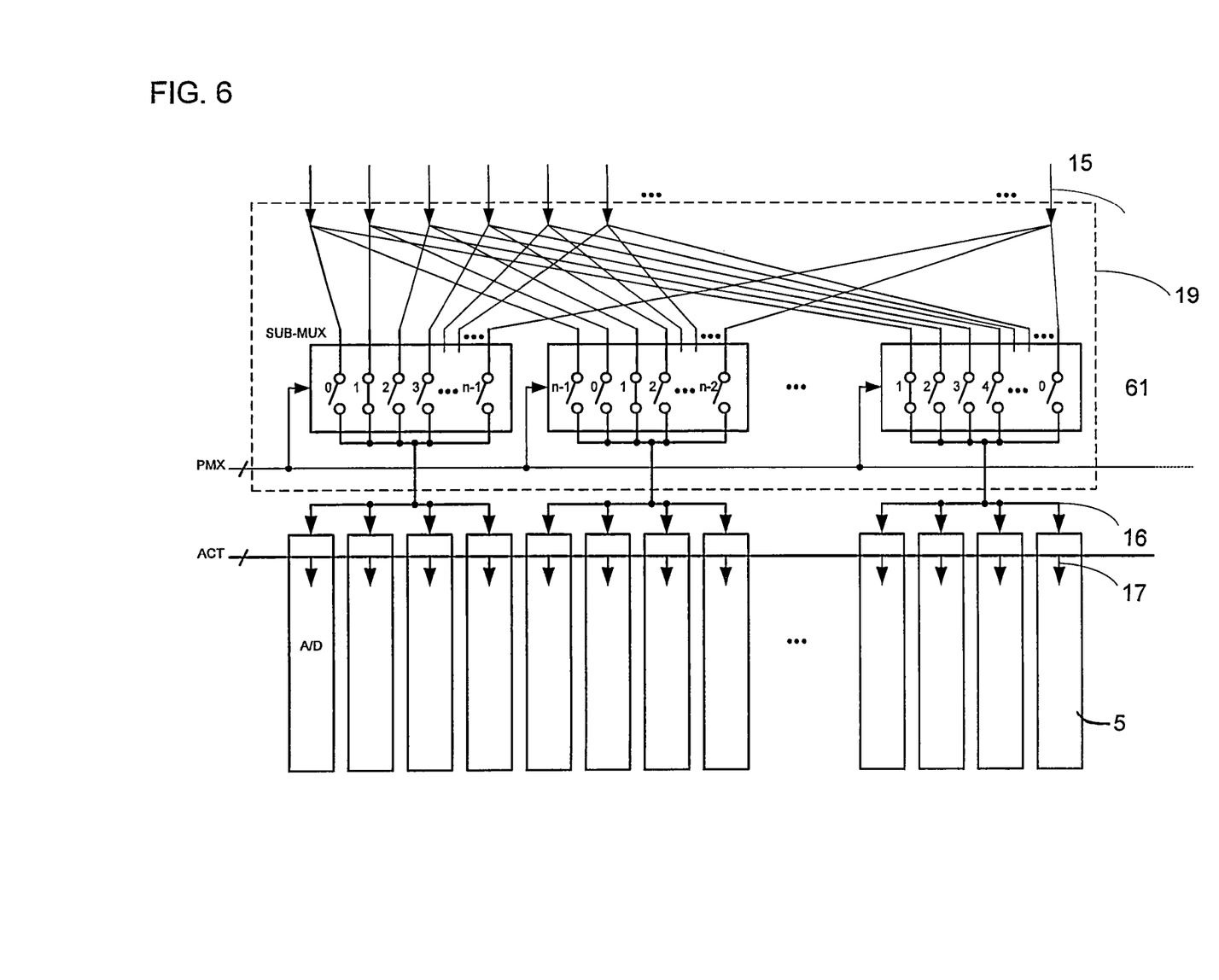
FIG. 6 is a block diagram of an analog signal multiplexer including sub-multiplexers according to another aspect of the present disclosure.

FIG. 6 is a block diagram according to another embodiment of an efficient implementation of the analog signal multiplexer.

The multiplexer 19 includes a plurality of sub-multiplexers 61 wherein each sub-multiplexer is connected to a plurality of A/D converters 5. Each multiplexer receives a plurality of analog signals from the vertical signal lines 15. For example, a multiplexer receives vertical signal lines represented as $VSL_j$ to $VSL_{j+n-1}$ for a case where the pixel block is n×n pixels. Each sub-multiplexer chooses one analog signal from $VSL_j$ to $VSL_{j+n-1}$ and outputs it to the A/D converters that are dedicated for that corresponding sub-multiplexer. Further, each sub-multiplexer sequentially changes the analog signal to be distributed to the A/D converters by a controlled signal represented as PMX. Further, a random pattern generator can also be used to distribute the analog signals to the sub-multiplexers.

Note that in this embodiment each sub-multiplexer chooses different analog signals of $VSL_j$ to $VSL_{j+n-1}$ at the same time. For example, a sub-multiplexer can choose a signal $VSL_j$ while the next sequential sub-multiplexer chooses the signal $VSL_{j+n-1}$. Further note that a lower number of A/D converters are allocated for each sub-multiplexer as compared to the total number of A/D converters that are allocated for a given multiplexer. This reduces the number of A/D conversions for a given analog signal. In other words, the number of A/D converters simultaneously connected to a given analog signal is drastically reduced in order to achieve a faster and lower power operation of the image sensor (less load capacitance).

According to the configuration of the second embodiment of the image sensor, the number of samplings at each A/D converter are reduced. For example, a unit of pixel block of 16×16 pixels, each A/D converter sequentially receives 256 analog signals during a cycle of A/D conversion, according to the first embodiment. Further, the decision as to whether to sample the analog signal or not is dependent on the bit stream of activation codes. In the second embodiment, each A/D converter receives a less number of analog signals during a cycle of A/D conversion. For example, when each sub-multiplexer sequentially and randomly chooses half of the analog signals, each A/D converter receives only 128 analog signals during an A/D conversion from a unit of 16×16 pixels. Thus, according to the second embodiment only 128 sampling clocks are needed for a cycle of A/D conversion.

Figure 7:
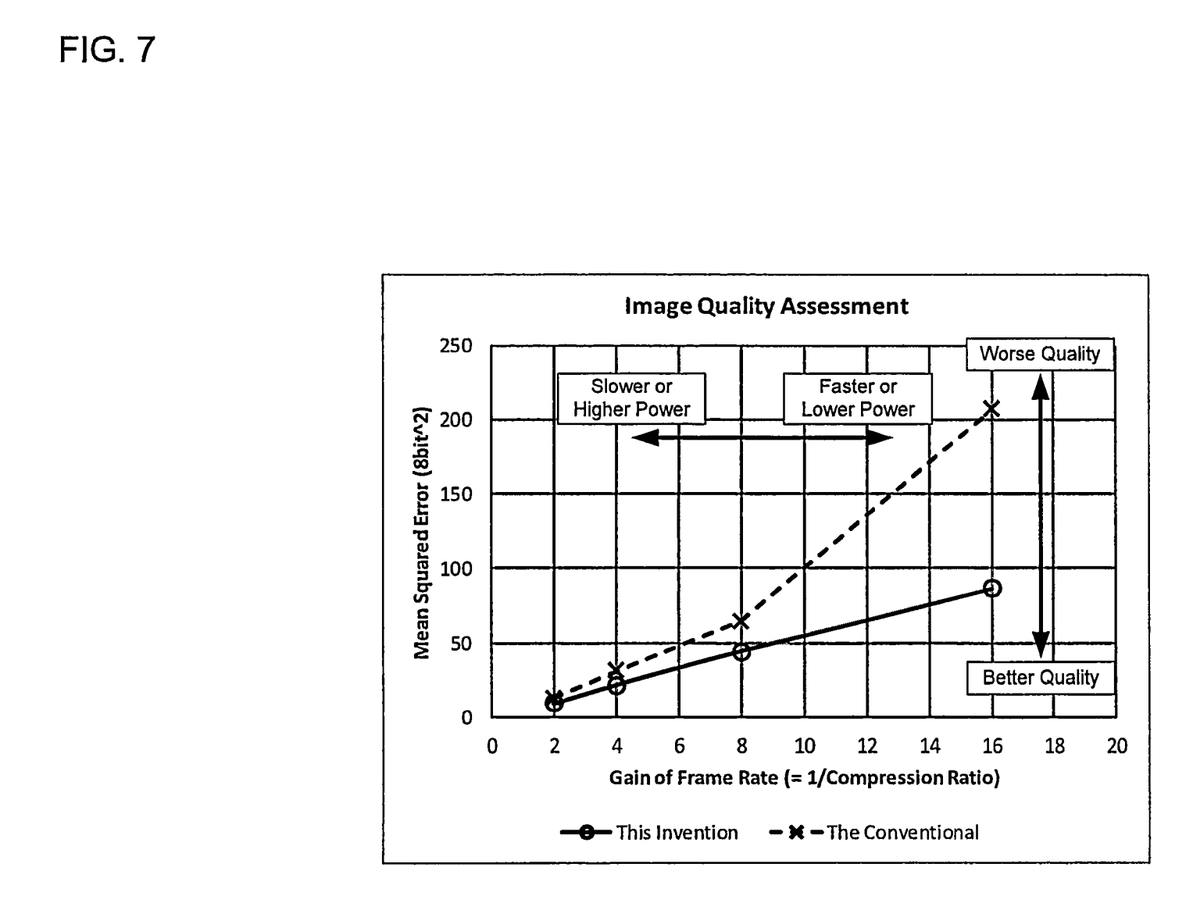
FIG. 7 is a graph of experimental results depicting an image quality assessment.
Figure 8:
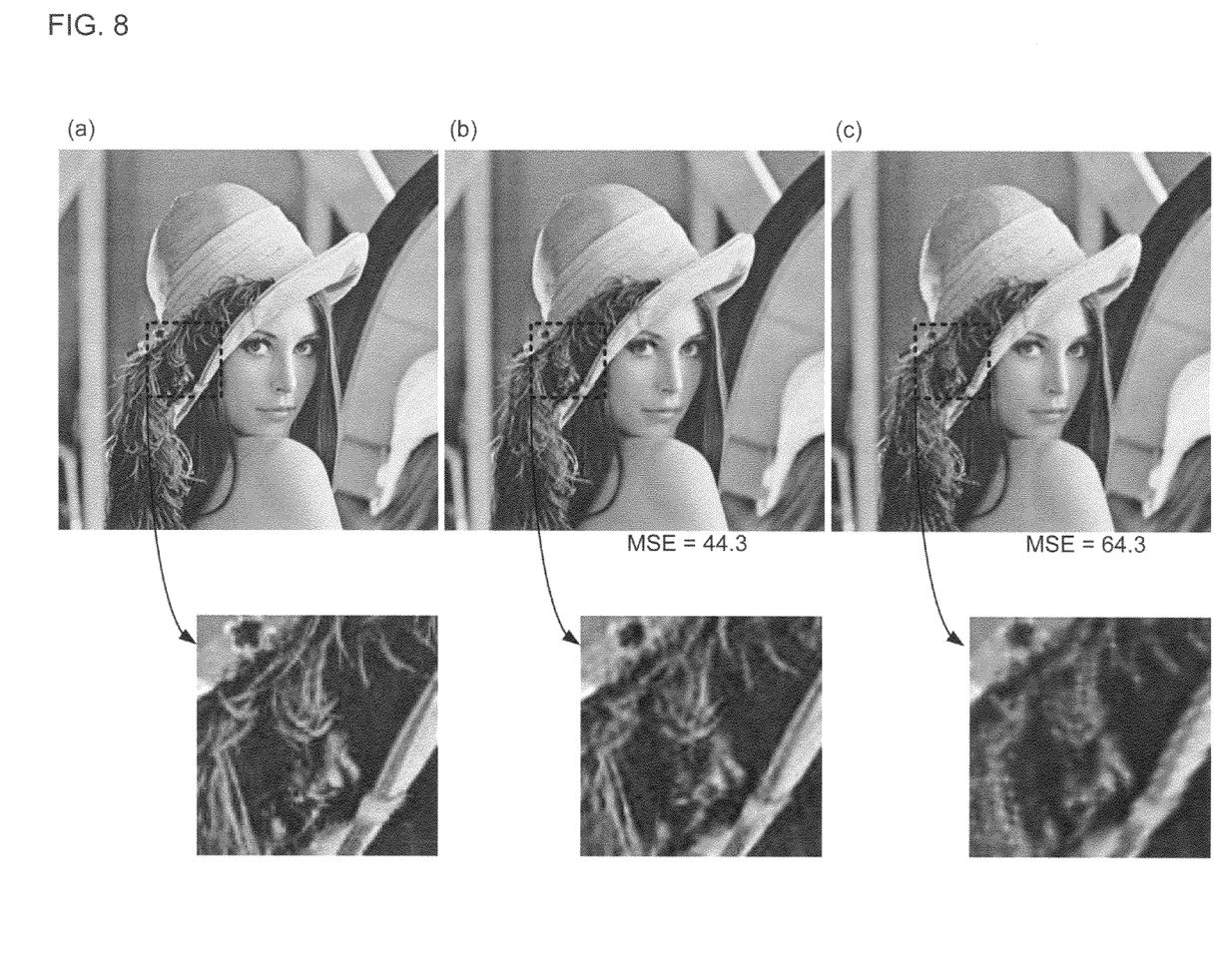
FIGS. 8(a)-8(c) are images of experimental results for a compression ratio of 1/8.

FIG. 7 is a graph illustrating the performance comparison of a method according one embodiment of the present disclosure to a typical approach of image processing, wherein the number of pixels accessed for data processing are reduced. FIG. 7 depicts the mean squared error (MSE) plotted on the Y-axis to the gain in frame rate plotted on the X-axis. Note that the gain in frame rate is inversely proportional to the compression ratio. Specifically, gain in frame rate=(1/compression ratio). Further, for experimental evaluation, the Lena sample image (well known sample image for image quality assessment as shown in FIG. 8) is used.

The method according an embodiment of the present disclosure achieves a better signal to noise ratio (SNR) as compared to the typical approach of image processing. In the typical approach, the detailed textures above the degraded sampling frequency are completely lost even though significant features are concentrated on the higher frequencies. Referring to FIG. 7, it can be observed that for a value of compression ratio equal to 1/8, the method according an embodiment of the present disclosure achieves a MSE=44.3, whereas the typical method achieves a MSE=64.3.

Further, with increasing frame rates, the performance of the typical approach is drastically degraded. For example, at a compression ratio of 1/16, the performance degrades more than two-orders of magnitude as compared to the method according an embodiment of the present disclosure. Furthermore, a capability of enhancing the frame rate (within a given power threshold) by an order of 2-16 times that of the frame rate of the typical method is achieved. Note that it is difficult for the typical approach to increase the frame rate, as frame rate is often limited by the bandwidth of the A/D conversions.

FIG. 8(a)-8(c) depicts the Lena sample image and illustrates the performance evaluation for a compression ratio equal to 1/8. The performance comparison of the typical approach is compared to the image reconstruction method by the image sensor of the present disclosure for a small area of the image, as shown by the dotted box.

FIG. 8 (a) depicts the original Lena image. FIG. 8(b) and FIG. 8(c) depict the experimental results obtained by image reconstruction performed by the typical method and the method according an embodiment of the present disclosure respectively. The typical method achieves a MSE of 64.3 as compared to an MSE of 44.3 obtained by the method of the present disclosure.

Figure 9:
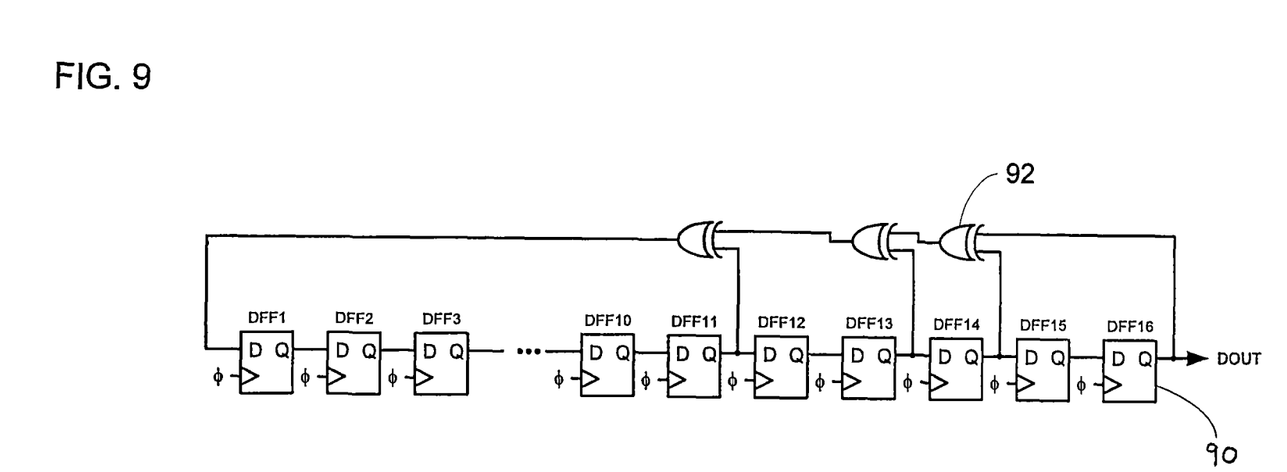
FIG. 9 is a schematic diagram of a pseudo-random shift register according to one embodiment of the present disclosure.

FIG. 9 illustrates a configuration of a pseudo-random shift register used to generate activation codes to activate the A/D converters according to a preferred embodiment of the present disclosure.

The bit streams of activation codes need not be strictly random. In general a pseudo-random configuration is sufficient to recover an original image while employing compressed sensing. Although a pseudo-random generator is used to generate activation codes, we note that this is in now way limiting the scope of the present disclosure. In fact, any binary matrix can be used to generate the codes as long as the binary matrix is incoherent/uncorrelated to the with a sparse transform matrix (such as the DCT). Note that is the incoherency degrades, the required number of measurements, M, is larger in order to recover the original image with the same quality.

FIG. 9 is a block diagram of a 16-bit shift register including 16 delay flip flops, 90, represented as DFF1-DFF16 and 3 exclusive-or gates 92, connected at the output terminals of DFF 11, DFF 13 and DFF 14 respectively. A delay flip flop also known as data flip flop captures the value at the D input terminal at a definite portion of a clock signal Φ (such as a rising edge of a clock signal) and transfers the captured value to the Q terminal. At other times, the output at the Q terminal does not change. A particular advantage of using the D flip-flop is that the signal on the D input terminal is captured the moment the flip-flop is clocked, and subsequent changes on the D input are ignored until the next clock event.

Further, each of the exclusive-or gates provide a low output when the two inputs to the gate are same and provide a high output when the inputs differ. The 16 bit shift register as depicted in FIG. 9 can be initialized by any arbitrary binary pattern, except a pattern wherein all bits are zero. The shift register provides a bit stream of pseudo-random configuration from an output terminal DOUT, in synchronization with the clock signal.

Figure 10:
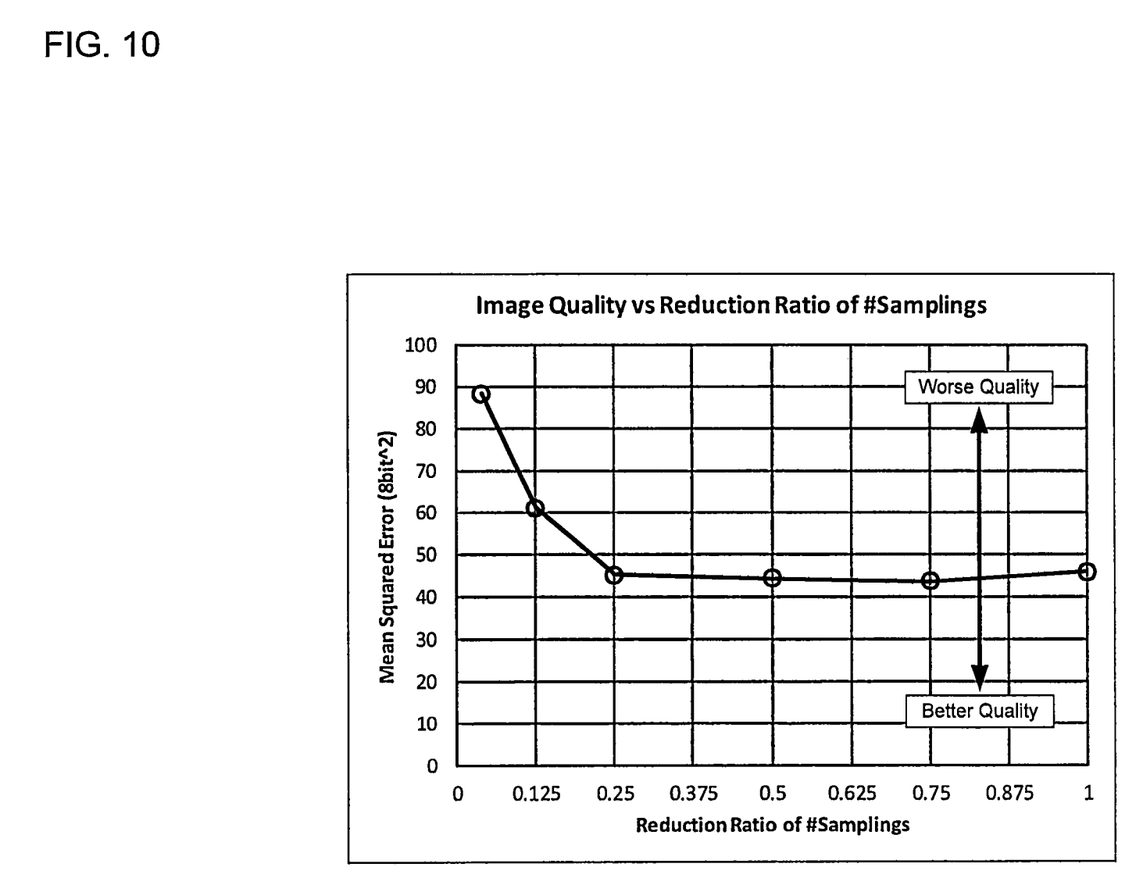
FIG. 10 is a graph of experimental results of image reconstruction depicting the mean-squared error versus a reduction of the ratio of samplings.

FIG. 10 is a graph illustrating the image quality as compared with the reduction ratio of a number of samplings for a compression ratio of 1/8. The graph in FIG. 10 depicts the MSE plotted on the Y-axis vs. the reduction ratio of the number of samplings plotted on the X-axis.

As stated previously, the transform basis Φ must be uncorrelated with a compressible basis Ψ. A usual choice for Φ is a random binary matrix in the field of compressed sensing. The random reduction of samplings at the sub-multiplexers according to one embodiment of the present disclosure, indicates a control of the density of ones/zeros in the random binary matrix, as the transform basis Φ is obtained a binary matrix multiplied with a bit stream of activation codes at each A/D converter. Further, a transform basis Φ can maintain the incoherency with Ψ even though the density of ones/zeros changes slightly.

FIG. 10 illustrates the experimental results for the MSE against the density of ones in a transform basis Φ. The results confirm that a sufficient incoherency between Φ and Ψ can be obtained by a method of the present disclosure to recover the image even if the number of samplings is reduced approximately half the number of pixels in a pixel block.

Figure 11:
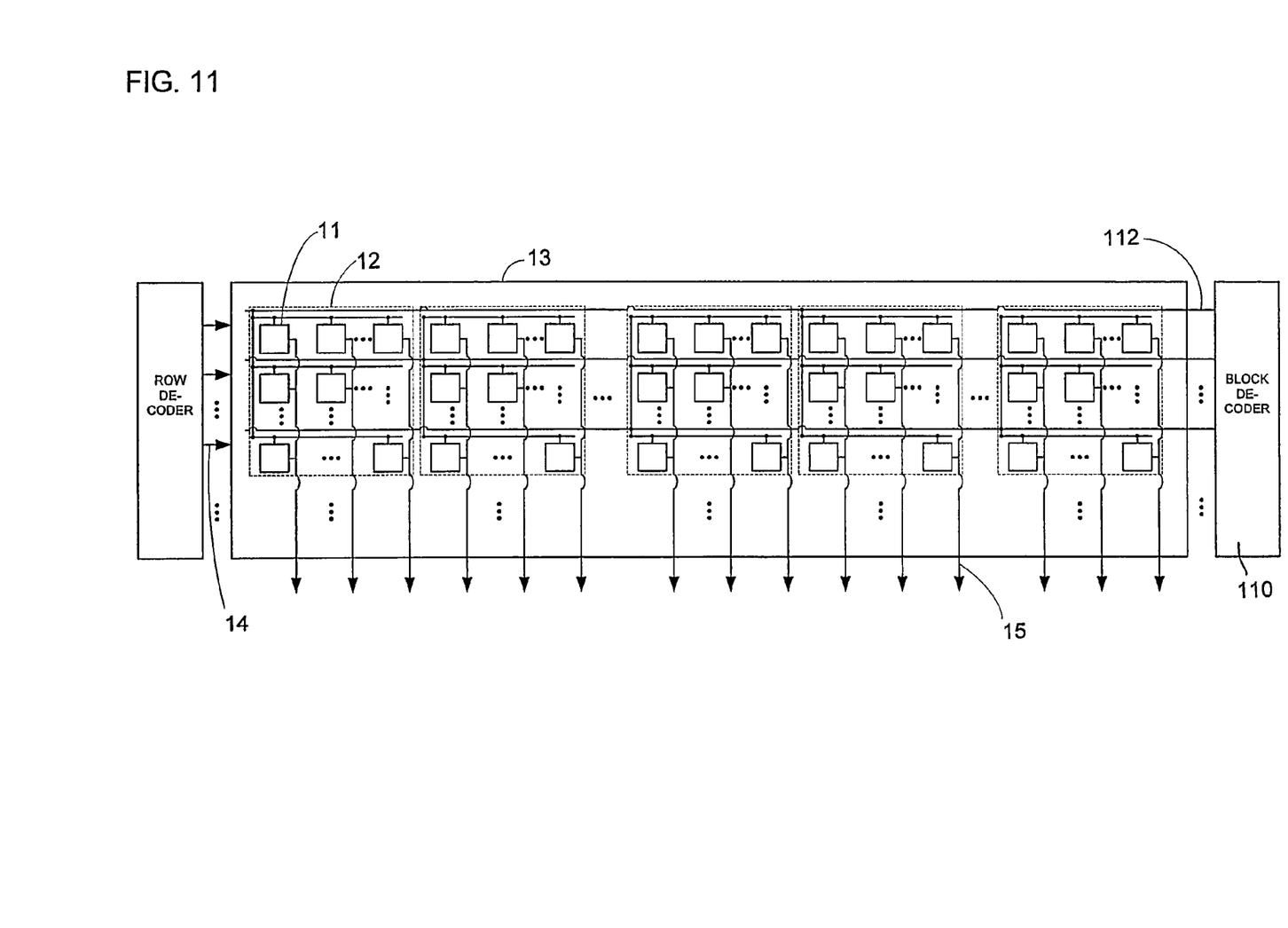
FIG. 11 is a configuration of a pixel array of the image sensor according to another embodiment of the present disclosure.

FIG. 11 is a configuration of a pixel array according to another embodiment of the present disclosure.

Specifically, this embodiment discloses a method of controlling the period of integrating the photo-electrons in each unit of the pixel block. Note that the same integration period can be applied to each pixel in the unit of pixel block. FIG. 11 depicts a two-dimensional pixel arrangement that comprises a row decoder 7, and a block decoder 110. The block decoder provide the transfer gate (TRG) and reset gate (RST) signals as shown in FIG. 2, to the pixel array as block control signals 112. Each block control signal is connected to one or more units of pixel blocks. Note that a block decoder can be realized in the same manner as a row decoder. Further, the connections 14 of the row decoder, provide control signals SEL (select gate) which are similar to the ones depicted in FIG. 1.

Obviously, numerous modifications and variations of the present invention are possible in light of the above teachings. It is therefore to be understood that within the scope of the appended claims, the invention may be practiced otherwise than as specifically described herein. Specifically, any size two-dimensional array (for example 1000×1000) can be created using the methods described in the present disclosure. Note however, that the size of the pixel block affects the quality of the recovered image. Generally, the larger the block size, the better the recovered image quality. However, a large block size requires a large number of samplings at each A/D converter and thus makes the operational speed of the device slower.

Further, the photo-detectors may be fabricated using a back-side illuminated silicon chip. The shift register may be realized by using any type of flip-flip units. Furthermore, the state of art pixel structure such as a 4T pixel can be easily incorporated in the pixel block of the present disclosure, thus achieving multi-mega pixel resolution, low dark noise, high sensitivity and a high signal to noise ratio readout.

The above disclosure also encompasses the embodiments noted below.

(1) An image sensor comprising: a plurality of pixel elements, wherein each pixel element is configured to generate an analog signal corresponding to an intensity of light impinged on the pixel element; a plurality of analog to digital, A/D, converters, wherein each A/D converter is configured to sample a corresponding average value of an input analog signal and convert the input analog signal to a digital signal based on a predetermined activation code that determines which of the plurality of A/D converters is activated; and a plurality of multiplexers, wherein each multiplexer is connected to a pixel block and a first subset of the plurality of A/D converters and is configured to sequentially select and distribute the analog signal and following analog signals from the pixel block to the A/D converters in a cycle of A/D conversion.

(2) The image sensor of (1), wherein the pixel block comprises a second subset of the plurality of pixel elements and is connected to the multiplexer via a plurality of signal lines.

(3) The image sensor of (1), wherein the first subset of the plurality of A/D converters is less than the second subset of the plurality of pixel elements.

(4) The image sensor of (1), wherein the A/D converter is a sigma-delta modulator.

(5) The image sensor of (1), further comprises a plurality of filters that are configured to receive a string of binary bits and convert the string of binary bits to a digital value corresponding to the average value of the input analog signal.

(6) The image sensor of (1), wherein the A/D converter comprises an accumulator configured to sum up the selected input analog signals.

(7) The image sensor of (1), further comprises a row decoder that is configured to select a row of pixel elements from the pixel block and output the analog signal from each of the pixel element on the corresponding signal line.

(8) The image sensor of (1), wherein the pixel element comprises a photo detector configured to generate photo-electrons corresponding to the intensity of light impinged on the pixel element.

(9) The image sensor of (7), wherein the pixel element further comprises a transfer gate that transfers the photo-electrons to a capacitance node to generate a signal voltage level corresponding to the number of photo-electrons.

(10) The image sensor of (9), wherein the pixel element further comprises a reset gate configured to apply a reference voltage to the capacitance node; an amplifier gate configured to amplify a voltage level of the capacitance node; and a select gate configured to connect the amplifier gate to the signal line.

(11) The image sensor of (9), wherein the select gate is shared by adjacent pixel elements.

(12) The image sensor of (9), wherein the transfer gate and select gate of a plurality of unit of pixel blocks are controlled simultaneously.

(13) The image sensor of (1), wherein the activation code is generated by an activation code generator that comprises a plurality of pseudo-random shift registers.

(14) The image sensor of (13), wherein the activation code is a random binary configuration.

(15) The image sensor of (13), wherein the activation code generator comprises a memory for storing the bits of the activation code.

(16) The image sensor of (1), wherein each multiplexer of the plurality of multiplexers further comprises a plurality of sub-multiplexers connected to the same pixel block, each sub-multiplexer of the plurality of sub-multiplexers is connected to a third subset of the plurality of A/D converters.

(17) The image sensor of (16), wherein the third subset of the plurality of A/D converters is smaller than the first subset of the plurality of A/D converters.

(18) The image sensor of (16), wherein each sub-multiplexer processes a different input analog signal at the same time.

(19) The image sensor of (16), wherein each sub-multiplexer randomly chooses an input analog signal from the plurality of input analog signals received by the corresponding multiplexer based on a random pattern generator.

(20) An image processing method performed by an image sensor, the method comprising: generating a plurality of analog signals from a plurality of pixel elements, each analog signal corresponding to an intensity of light impinged on the corresponding pixel element; selecting by a decoder, a subset of analog signals generated by the generating; multiplexing sequentially the subset of analog signals selected by the selecting and distributing the subset of analog signals to a plurality of analog to digital, A/D, converters; generating a random activation code that determines which of the plurality of A/D converters is activated; and obtaining a digital readout of the analog signals from the activated A/D converters.

The invention claimed is:

1. An image sensor comprising:
a plurality of pixel blocks including pixel elements, wherein each pixel element is configured to generate an analog signal corresponding to an intensity of light impinged on the pixel element;
a plurality of analog to digital, A/D, converters connected to each of the pixel block, wherein each A/D converter is configured to sample a corresponding average value of an input analog signal and convert the input analog signal to a digital signal based on a predetermined activation code that determines which A/D converters of the plurality of A/D converters are activated; and
a plurality of multiplexers, wherein each multiplexer is connected to the pixel block and the plurality of A/D converters and is configured to sequentially select and distribute the analog signal and subsequent analog signals obtained from the pixel block to the plurality of A/D converters in a cycle of A/D conversion.

2. The image sensor of claim 1, wherein the pixel block is connected to the multiplexer via a plurality of signal lines.

3. The image sensor of claim 1, wherein the plurality of A/D converters connected to each of the pixel block is less than a number of the pixel elements included in the pixel block.

4. The image sensor of claim 1, wherein the A/D converter is a sigma-delta modulator.

5. The image sensor of claim 1, wherein each A/D converter includes a filter that is configured to receive a string of binary bits and convert the string of binary bits to a digital value corresponding to the average value of the input analog signal.

6. The image sensor of claim 1, wherein the A/D converter comprises an accumulator configured to sum up the selected input analog signals.

7. The image sensor of claim 1, further comprises a row decoder that is configured to select a row of pixel elements from the pixel block and output the analog signal from each of the pixel element on the corresponding signal line.

8. The image sensor of claim 1, wherein the pixel element comprises a photo detector configured to generate photo-electrons corresponding to the intensity of light impinged on the pixel element.

9. The image sensor of claim 7, wherein the pixel element further comprises a transfer gate that transfers the photo-electrons to a capacitance node to generate a signal voltage level corresponding to the number of photo-electrons.

10. The image sensor of claim 9, wherein the pixel element further comprises
 a reset gate configured to apply a reference voltage to the capacitance node;
 an amplifier gate configured to amplify a voltage level of the capacitance node; and
 a select gate configured to connect the amplifier gate to the signal line.

11. The image sensor of claim 9, wherein the select gate is shared by adjacent pixel elements.

12. The image sensor of claim 9, wherein the transfer gate and select gate of a plurality of pixel blocks are controlled simultaneously.

13. The image sensor of claim 1, wherein the activation code is generated by an activation code generator that comprises a plurality of pseudo-random shift registers.

14. The image sensor of claim 13, wherein the activation code is a random binary configuration.

15. The image sensor of claim 13, wherein the activation code generator comprises a memory for storing the bits of the activation code.

16. An image sensor comprising:
 a plurality of pixel elements, wherein each pixel element is configured to generate an analog signal corresponding to an intensity of light impinged on the pixel element;
 a plurality of analog to digital, A/D, converters, wherein each A/D converter is configured to sample a corresponding average value of an input analog signal and convert the input analog signal to a digital signal;
 a plurality of multiplexers, wherein each multiplexer is connected to a pixel block and a first subset of the plurality of A/D converters and is configured to sequentially select and distribute the analog signal and following analog signals from the pixel block to the A/D converters in a cycle of A/D conversion, wherein each multiplexer of the plurality of multiplexers further comprises a plurality of sub-multiplexers connected to the same pixel block, each sub-multiplexer of the plurality of sub-multiplexers is connected to a second subset of the plurality of A/D converters.

17. The image sensor of claim 16, wherein the second subset of the plurality of A/D converters is smaller than the first subset of the plurality of A/D converters.

18. The image sensor of claim 16, wherein each sub-multiplexer processes a different input analog signal at the same time.

19. The image sensor of claim 16, wherein each sub-multiplexer randomly chooses an input analog signal from the plurality of input analog signals received by the corresponding multiplexer based on a random pattern generator.

20. An image processing method performed by an image sensor, the method comprising:
 generating a plurality of analog signals from a plurality of pixel blocks, each pixel block including a plurality of pixel elements, each analog signal corresponding to an intensity of light impinged on the corresponding pixel element;
 selecting by a decoder, a subset of analog signals generated by the generating;
 multiplexing sequentially the subset of analog signals selected by the selecting and distributing the subset of analog signals to a plurality of analog to digital, A/D, converters connected to each of the pixel block;
 generating a random activation code that determines which A/D converters of the plurality of A/D converters are activated; and
 obtaining a digital read-out of the analog signals from the activated A/D converters.

* * * * *